United States Patent [19]

Kemeny

[11] Patent Number: 5,101,293
[45] Date of Patent: Mar. 31, 1992

[54] ELECTROOPTIC DEVICE FOR MODULATION OF INTENSITY AND PHASE OF TRANSMITTED OR REFLECTED LIGHT AT DISCRETE OPERATING WAVELENGTHS

[75] Inventor: Peter C. Kemeny, Camberwell, Victoria, Australia

[73] Assignee: Australian Telecommunications Corporation, Melbourne, Australia

[21] Appl. No.: 547,871

[22] Filed: Jul. 3, 1990

Related U.S. Application Data

[63] Continuation-in-part of Ser. No. 403,534, Sep. 6, 1989, Pat. No. 5,052,008.

[30] Foreign Application Priority Data

Jan. 6, 1988 [AU] Australia ............... PI6190

[51] Int. Cl.$^5$ ............... H01L 33/02; G02B 5/14; G02F 1/15; G02F 1/03
[52] U.S. Cl. .................. 359/254; 359/315; 385/3; 385/14
[58] Field of Search ............... 350/96.13–15, 350/355, 356; 357/16, 17, 19; 385/3, 8, 14; 359/254, 315

[56] References Cited

U.S. PATENT DOCUMENTS

| | | | |
|---|---|---|---|
| 4,521,069 | 6/1985 | Ikeda | 350/96.13 |
| 4,525,687 | 6/1985 | Chemla et al. | 372/7.51 |

FOREIGN PATENT DOCUMENTS

| | | |
|---|---|---|
| 3210980 | 4/1982 | Fed. Rep. of Germany . |
| 58-135690 | 11/1981 | Japan . |
| 2126780 | 3/1984 | United Kingdom . |
| 84-03397 | 8/1984 | World Int. Prop. O. . |

OTHER PUBLICATIONS

Ogura et al., "Lasing Characteristics and Structure of Distributed Feedback Surface Emitting Laser Diode with AlGa/GaAs Multilayered Heterostructure," *Journal of Vacuum Science*, vol. 3, No. 2, pp. 784–7, Mar.-Apr. 1985.

Ogura et al., "Distributed Feedback Surface Emitting Laser Diode with Multilayered Heterostructure," *Japanese Journal of Applied Physics*, vol. 23, No. 7, pp. L512–514, Jul. 1984.

Ogura et al., "Surface Emitting Laser Diode with Multilayered Heterostructure Reflectors," *Collected Papers of 2nd International Symposium on Molecular Beam Epitaxy and Related Techniques*, pp. 69–72, 1982.

Uchiyama et al., "Consideration on Threshold Current Density of GaInAsP/InP Surface Emitting Junction Lasers," *IEEE Journal of Quantum Electronics*, vol. QE-22, No. 2, pp. 302–309, Feb. 1986.

Iga et al., "Room Temperature Pulsed Oscillation of GaAlAs/GaAs Surface Emitting Junction Laser," *IEEE Journal of Quantum Electronics*, vol. QE-21, No. 6, pp. 663–668, Jun. 6, 1989.

Kemeny, P. C.; "III–IV Semiconductor Thin-Film Optics..."; J. Appl. Phys., vol. 64, No. 11, pp. 6150–4, 12/1/88; abst. only provided.

Boyd et al.; "Multiple Quantum Well Reflecton Modulator"; Appl. Phys. Lett., vol. 50, #17, pp. 1119–21, 4/21/87: abst. only.

Miller et al.; "High Frequency...Optical Modulator"; IEEE Trans. Elect. Devices, vol. ED-34, #11, pp. 2362; abst. only.

*Primary Examiner*—Nelson Moskowitz
*Attorney, Agent, or Firm*—Fish and Richardson

[57] ABSTRACT

An electrooptic modulator includes structure defining a single crystal substrate upon which are positioned, in succession, an inside reflector formed by a set of epitaxial single crystal layers, a resonator layer and an outside reflector formed by another set of epitaxial single crystal layers. A first part of the structure, including one or more of the inside reflector, substrate and resonator layer, is electrically conductive (either p-type or n-type conduction) and a second part, including the outside reflector and/or the resonator layer, is electrically conductive (either n-type or p-type conduction, but a different to the first part). The structure further includes first and second electrical conductors in ohmic contact respectively with the first and second part of the structure thereby to enable, by application of electrical potential to the electrical conductors, a reverse bias to be applied to the structure to cause an electric field to be applied across the resonator layer whereby the refractive index of the resonator layer is varied by varying the electric field pursuant to variation of the bias, to correspondingly modulate light in use passing through the modulator.

14 Claims, 1 Drawing Sheet

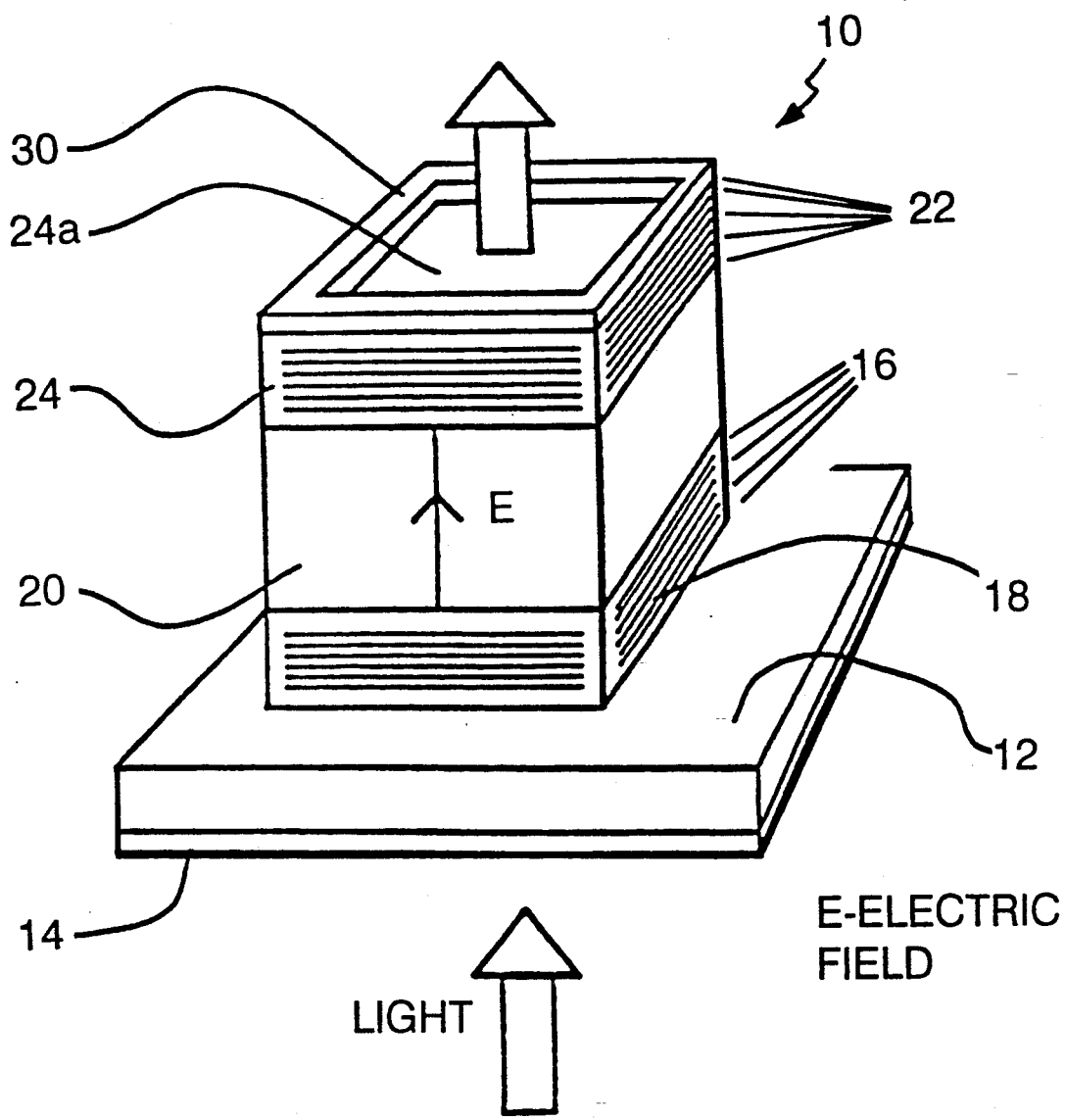

ELECTROOPTIC DEVICE FOR MODULATION OF INTENSITY AND PHASE OF TRANSMITTED OR REFLECTED LIGHT AT DISCRETE OPERATING WAVELENGTHS

This application is a continuation-in-part of U.S. application Ser. No. 07/403,534, filed Sept. 6, 1989, now U.S. Pat. No. 5,052,008.

This invention relates to an electro optic modulator.

The modulator of the invention is constructed from semi-conductor layers which are transparent to light over a wide range of wavelengths. The device is able to modulate the intensity of transmitted or reflected light as well as the phase of transmitted or reflected light having a wavelength at or near a number of discrete wavelengths which bear a simple relationship to each other, as descripted later. These discrete operating wavelengths may be chosen arbitrarily within a wide range by adjusting the dimensions and/or composition of the device. The modulation is effected by varying the voltage applied to the device to render it operative.

In one aspect, the invention provides an electrooptic modulator comprising structure defining a single crystal substrate, having some refractive index, on which are positioned, in succession, an inner reflector formed by a first set of epitaxial single crystal layers, a resonator layer, an outside reflector formed by a second set of epitaxial single crystal layers, at least one part of said structure, being of one or more of the inside reflector, substrate and resonator layer, being electrically conductive and of either p-type or n-type conduction, at least another part of said structure, being one or more of the outside reflector, and resonator layer, being made electrically conductive and being of either n-type or p-type conduction, but of different conduction type to said one part, said structure further including first and second electrically conductive means making ohmic contact respectively to said one part and said another part of said structure whereby to enable, by application of electrical potential to said electrically conductive means, a reverse bias to be applied to said structure to cause an electric field to be applied across said resonator layer whereby the refractive index of the resonator layer is varied by varying said electric field pursuant to variation of said bias, to correspondingly modulate light in use passing through the modulator.

The layers comprising at least one said reflector may have alternating high and low refractive indices and thicknesses such that a compositional periodicity of optical thickness $\lambda/2$ or an odd multiple thereof is achieved where $\lambda$ is the longest of a number of possible discrete wavelengths of light to be modulated by the particular device.

These discrete operating wavelengths may be chosen arbitrarily within a wide range by adjusting the dimensions and/or composition of the device.

In an alternative embodiment the composition and hence the refractive index of at least one said reflector can be varied in a continuous or piece-wise manner such that a compositional periodicity having optical thickness of $\lambda/2$ or some odd multiple thereof is achieved.

The refractive index $N_r(V)$ varies as some function of the electric field present in the resonator layer, arising as the result of the external application of a potential difference, V, across the resonator, at least for some particular palorisations of light travelling through this layer in some particular direction.

The device has a maximum of transmission at wavelengths $\lambda_m$ given by:

$$\frac{2\pi N_r(V) d \cos\theta}{\lambda_m} - \frac{\phi_1 + \phi_2}{2} = m\pi$$

$$m = 0, 1, 2 \ldots$$

where $\theta$ is the angle of propogation of light in the resonator layer relative to the normal to this layer, whilst the phases $\phi_1$, $\phi_2$ (defined below) and the refractive index $N_r(V)$ refer to light of any particular allowed propogation mode in the resonator layer, when a voltage V is applied between the metalisations of the modulator. "m" may be chosen to be in the range 0 to 20.

$\phi_1$ and $\phi_2$ are defined, with reference to the complex reflectance amplitudes $r_i$, $r_o$ of the inside and outside reflectors, by the following relationships:

$$r_i = r_1 \exp(j\phi_1)$$

where $r_1$ is the amplitude of reflectance of layers comprised in the inner reflector, and $\phi_1$ is the phase shift on such reflectance.

$$r_o = r_2 \exp(j\phi_2)$$

where $r_2$ is the amplitude of reflectance of layers in the outer reflector, and $\phi_2$ is the phase shift on such reflectance.

The refractive index $N_b$ of the layer of the inside reflector adjacent to the resonator layer, and $N_a$, the refractive index of the layer of the outside reflector immediately adjacent the resonator layer should be related to $N_r(V)$, the refractive index of the resonator layer at any particular operating voltage across the modulator either by:

$$N_b < N_r(O) \text{ if } N_a < N_r(O)$$

or $$N_b > N_r(O) \text{ if } N_a > N_r(O)$$

Furthermore, in the case where, as is usual, $$\phi_1 + \phi_2 = 2\pi$$

$$\phi_1 + \phi_2 = 0$$

The above equation relating $\lambda_m$, m, $N_r(V)$ and d may be reduced to:

$$N_r(V) d \cos\theta = \frac{m' \lambda_{m'}}{2}$$

$$\text{where } m' = \begin{cases} m + 1, & \phi_1 + \phi_2 = 2\pi \\ m, & \phi_1 + \phi_2 = 0 \end{cases}$$

Thus, in accordance with this invention, in this instance, m' runs over values 1, ... 20.

The invention is further described by way of example only with reference to the accompanying drawings, the single FIGURE of which is a diagrammatic perspective view of an electrooptic modulator constructed in accordance with this invention.

The modulator 10 shown in the drawing comprises a substrate 12 in the form of a single crystal having a refractive index $N_s$. The substrate may be provided on its "rear" face with one or more layers of material intended to reduce the reflectivity of the rear surface from its uncoated value, at the wavelength of operation of the modulator, and may have regions of metalisation intended to make ohmic contact to the device. In this instance, a layer 14 of metalisation is shown.

Upon the substrate is a first set of epitaxial single crystal layers 16 which together constitute an inside reflector 18. The composition, thickness, and a number of these layers constitute variables which are selected to give desirable properties of reflectivity, electrical conduction, transparency, stability and crystal growth parameters, in accordance with known factors for thin film optics and semiconductor technology.

The inside reflector is characterized in part, by its complex reflectance amplitude $r_i$ where:

$$r_i = r_1 \exp(j\phi_1),$$

where $r_1$ is the magnitude of reflectance of the set of layers comprising the inner reflector, and $\phi_1$ is the phase shift on such reflectance.

Positioned immediately above and in contact with inside reflector 18 is a resonator layer with thickness "d" and refractive index $N_r(V)$ for light travelling through this layer, where V is the potential difference applied across the modulator. This refractive index should have the property that either:

$$N_b < N_r(O) \text{ if } N_a < N_r(O)$$

or $$N_b > N_r(O) \text{ if } N_a > N_r(O),$$

where $N_b$ is the refractive index of the layer of the inside reflector 18 which is adjacent to the resonator layer and $N_a$ is the refractive index of that one of a number of layers 22 next described which is immediately adjacent and in contact with resonator layer 20, but at the opposite side thereof to inside reflector 18.

Above the resonator layer there is provided the aforementioned set of layers 22 each in the form of an epitaxial single crystal. These layers together constitute an outside reflector 24. As with the inside reflector 18, the layers 22 constituting the outside reflector are selected to give desirable properties of reflectivity, electrical conduction, transparency, stability and crystal growth parameters, in accordance with known factors for thin film optics and semiconductor technology.

The outside reflector 24 may be characterized in part by its complex reflectance amplitude $r_o$ where:

$$r_o = r_2 \exp(j\phi_2).$$

Where $r_2$ is the amplitude of reflectance of the set of layers comprising the outer reflector, and $\phi_2$ is the phase shift on such reflectance.

At the side of the outside reflector 24 remote from resonator layer 20, the reflector 24 is in contact with incident medium having refractive index $N_i$.

The substrate and subsequent material layers may be single crystals composed of any compounds or alloys of the elements of the periodic table, or pure elements, suitable for the purpose. For example, the substrate and subsequent layers may be composed of Gallium, Aluminium and Arsenic combined in particular proportions in particular layers.

Alternatively, the substrate and subsequent layers may be composed of Gallium, Indium, Arsenic, and Phosphorous combined in particular proportions in particular layers.

Alternatively, the substrate and subsequent layers may be composed of Gallium, Indium, Aluminium, Arsenic and Antimony combined in particular proportions in particular layers.

Alternatively, the substrate and subsequent layers may be composed of Mercury, Cadmium, Manganese and Tellurium combined in particular proportions in particular layers.

Alternatively, the substrate and subsequent layers may be composed of Lead, Sulphur Tellurium and Selenium combined in particular proportions in particular layers.

Other material systems are possible and will be apparent to those skilled in the art.

In addition each of the said layers may in turn be composed of still finer layers, known as superlattice or as multi-quantum-well structures, or the said layers may be continuously graded in composition. It is necessary that some part of the inside reflector and/or the substrate and/or the resonator layer be made electrically conducting by the incorporation of impurity atoms. This conduction, referred to hereinafter as conduction of the first type, may be by electrons (n-type) or holes (p-type).

A first metalisation (14) appropriate to make ohmic contact to the doped material of the first conduction type is applied on the substrate 12 or elsewhere on or near the modulator so as to make ohmic contact to this doped material only.

Some part of the outside reflector 24 and/or the resonator layer 20 is made electrically conducting by the incorporation of impurity atoms. This conduction, hereinafter called conduction of the second type, may be by electrons (n-type) or holes (p-type). If the first conduction type is n-type, then the second conduction type is p-type and if the first conduction type is p-type, the second conduction type is n-type.

A second metalisation appropriate to make ohmic contact to the doped material of the second conduction type is applied on or near the modulator so as to make ohmic contact to this doped material only. Such metalisation is shown as a metalised loop 30 formed on the surface 24a of outside reflector 24 remote from resonator layer 20.

It is convenient to refer to the entirety of the substrate 12, the inner and outer reflectors 18, 24, the resonator layer 20, together with the described metalisation and the other coatings to either side of the layer 20 or reflectors 18, 24, as a "material structure". One or more modulators 10 or groups of modulators 10 may be formed on the material structure by etching or by other means of isolation so that when a reverse bias voltage is applied between the metalisation making contact to those parts of the material structure which are respectively of first and second conduction types, and associated with a particular modulator or group of modulators an electric field is applied predominatly along a direct path between the n-type and p-type materials of each particular modulator so connected. The reverse bias is, as is conventional, obtained by raising the electrical potential of the n-type material above that of the p-type material.

In this case, there is no substantial current flow, but an electric field is generated across the resonator layer. The refractive index of this layer is alterable by varying the electric field, such as by varying the electrical potential.

The modulator structure described here and illustrated in the FIGURE may be partially or fully surrounded by materials including semiconductors (either irradiated by energetic particles such as protons or otherwise), polymers, or dielectrics to provide passivation, reduce or enhance surface recombination, provide optical confinement, or to enhance environmental stability.

In plan view (from above) the modulator may be any shape including square, rectangular, circular or ellipsoidal. The side walls, if any, may be perpendicular to the substrate, or sloping or curved.

As mentioned, modulation of the transmission through the device of a beam of incident light of any particular wavelength $\lambda_i$ is achieved by varying the applied voltage, V, hence the refractive index $N_r(V)$. This variation in refractive index causes the wavelength positions of the transmission maxima of the modulator $\lambda_m$, to vary, according to the expression just above given, relative to the wavelength $\lambda_i$ and hence the transmission of light by the modulator is modulated. The intensity of the reflected light as well as the phases of the transmitted and reflected beams are also modulated. The phase modulations arise as a result of the changing optical thickness of the resonator layer.

To achieve optimum performance the modulator structure must be admittance matched to the incident medium. By way of example, if the substrate, high refractive index Ng and the low refractive index layers are composed of AlAs having refractive index Na, and if the structure terminates with a high index layer at the incident medium interface remote from the substrate, and if the number of low index layers in the inside reflector is y and the number of low index layers in the outside reflector is x, and if the modulator is illuminated at normal incidence then the optical admittance of the modulator structure, Y, is $$Y = Ng(Ng/Na)^{2(x-y)}$$

If the incident medium is air having optical admittance Y=1 to a good approximation, then admittance matching to a good approximation over the full transparency wavelength range of the device is achieved when $$y = x + 4$$

The earlier mentioned equation relating $N_r(V)$, D, $\theta$, $\lambda_m$, $\phi_1$, $\phi_2$ and m may, as previously indicated, be simplified, for the case where:

$$\phi_1 + \phi_2 = 2\pi$$

to:

$$N_r(V) d \cos\theta = \frac{m' \lambda_{m'}}{2}$$

where m'=m+1.

Generally it has been found convenient to choose a value of m or m' which is not too great. The values in the range, for m, from 0 to 20, or, for m' from 1 to 21 may operate satisfactorily. m' may be selected to be 14, for example.

The modulator described here is suitable for operation at any wavelength within the transparency range of the materials of construction. However, if the resonator layer is chosen to be a multiquantum well structure, and the wavelength of operation is chosen to correspond to the excitonic region, just below the fundamental energy gap of the resonator layer, as revealed by Chemla et al in U.S. Pat. No. 4,525,687 then the performance of the device will be significantly improved, compared to operation at other wavelengths.

The difference between the present device and that described by Chemla et al is:

1. Operation is not restricted to the wavelength region near the band-gap although it will be optimum there.

2. The Fabry-Perot cavity of the present device is monolithically integrated into a single material structure whereas the device described by Chemla et al consists of discrete components.

3. The inside and outside reflectors of the present device provide the electrical contact to the multiquantum well resonator layer whereas in Chemla's device separate contacts are required.

4. Chemla et al failed to appreciate the significance of admittance matching of the modulator to the incident medium to optimise optical transmission and modulation efficiency.

Modulators formed in accordance with the invention have the significant advantage that they can be formed without requiring formation of mirror facets by cleaving, etching.

In one embodiment the modulator may for example, be a cylinder having a diameter of approximately 10 micrometers. This will yield good mode matching to small core optical fibres and thus, low insertion loss. The power density at the input/output facets will be small compared to semiconductor waveguide modulators, thus allowing higher power operation without facet damage. These properties, which will also be present in many other embodiments of the device, are advantageous for applications including fibre-optical communications, optical data storage and retrieval, optical computing, and intensity modulation of laser beams. Modulators arranged in side by side position, such as in linear or two-dimensional arrays may be readily constructed.

The described modulator has been advanced merely by way of explanation, and many modifications and variations may be made within the scope of the appended claims.

What is claimed is:

1. An electrooptic modulator comprising structure defining a single crystal substrate, having some refractive index, on which are positioned, in succession, an inside reflector formed by a first set of epitaxial single crystal layers, a resonator layer selected according to the equation:

$$\frac{2\pi N_r(V) d \cos\phi}{\lambda m} - \frac{\phi_1 + \phi_2}{2} = m\pi$$

where is the angle of propagation of light in the resonator layer relative to the normal to this layer, $\phi_1$ and $\phi_2$ are phase shifts of the reflectance, and $N_r(V)$ is the refractive index, an outside reflector formed by a second set of epitaxial single crystal layers, at least one part of said structure, being of one or more of the inside reflector, substrate and resonator layer, being electrically conductive and of either p-type or n-type conduction, at least another part of said structure, being one or more of the outside reflector, and resonator layer, being made electrically conductive and being of either n-type or p-type conduction, but of different conduction type to said one part, said structure further including first and second electrically conductive means making ohmic contact respectively to said one part and said another part of said structure whereby to enable, by application of electrical potential to said electrically conductive means, a reverse bias to be applied to said structure to cause an electric field to be applied across said resonator layer whereby the refractive index of the resonator layer is varied by varying said electric field pursuant to variation of said bias, to correspondingly modulate light in use passing through the modulator.

2. An electrooptic modulator as claimed in claim 1 wherein the complex reflectance amplitudes $r_i$ and $r_o$ of the inside reflector and outside reflector are defined as follows:

$$r_i = r_1 \exp(j\phi_1)$$

where $r_1$ is the magnitude of reflectance of the set of layers comprising the inner reflector, and $\phi_1$ is the phase shift on such reflectance, and $$r_o = r_2 \exp(j\phi_2)$$

where $r_2$ is the magnitude of reflectance of the set of layers comprising the outer reflector, and $\phi_2$ is the phase shift on such reflectance.

3. An electrooptic modulator as claimed in claim 1 or claim 2 wherein the refractive index $N_b$ of the layer of the inside reflector adjacent to the resonator layer, and $N_a$, the refractive index of the layer of the outside reflector immediately adjacent the resonator layer are related to $N_r(V)$, the refractive index of the resonator layer at any particular operating voltage across the modulator by:

$$N_b < N_r(O) \text{ if } N_a < N_r(O)$$

4. An electrooptic modulator as claimed in claim 1 or claim 2 wherein the refractive index $N_b$ of the layer of the inside reflector adjacent to the resonator layer, and $N_a$, the refractive index of the layer of the outside reflector immediately adjacent the resonator layer are related to $N_r(V)$, the refractive index of the resonator layer at any particular operating voltage across the modulator by:

$$N_b > N_r(O) \text{ if } N_a > N_r(O)$$

5. An electrooptic modulator as claimed in claim 1 wherein the layers comprising at least one of said reflectors having alternating high and low refractive indices and thicknesses such that a compositional periodicity of optical thickness $\lambda/2$ or an odd multiple thereof is achieved, where $\lambda$ is the longest of a number of possible discrete wavelengths of light to be modulated by the particular device.

6. An electrooptic modulator as claimed in claim 1 wherein the composition and hence the refractive index of at least one of said reflectors is varied in a continuous or piece-wise manner such that a compositional periodicity having optical thickness of $\lambda/2$ or some odd multiple thereof is achieved.

7. An electrooptic modulator as claimed in claim 1 wherein said substrate and, said resonator layer, said inside reflector, and said outside reflector are single crystals of materials selected from the group comprising Gallium, Aluminium and Arsenic combined in particular proportions in said resonator layer, said inside reflector, and said outside reflector.

8. An electrooptic modulator as claimed in claim 1 wherein said substrate, said resonator layer, said inside reflector, and said outside reflector are single crystals of materials selected from the group comprising Gallium, Indium, Arsenic and Phosphorous combined in particular proportions in said resonator layer, said inside reflector, and said outside reflector.

9. An electrooptic modulator as claimed in claim 1 wherein said substrate, said resonator layer, said inside reflector, and said outside reflector are single crystals of materials selected from the group comprising Gallium, Indium, Aluminium, Arsenic, and Antimony combined in particular proportions in said resonator layer, said inside reflector, and said outside reflector.

10. An electrooptic modulator as claimed in claim 1 wherein said substrate, said resonator layer, said inside reflector, and said outside reflector are single crystals of materials selected from the group comprising Mercury, Cadmium, Manganese and Tellurium combined in particular proportions in said resonator layer, said inside reflector, and said outside reflector.

11. An electrooptic modulator as claimed in claim 1 wherein said substrate, said resonator layer, said inside reflector, and said outside reflector are single crystals of materials selected from the group comprising Lead, Sulphur Tellurium and Selenium combined in particular proportions in said resonator layer, said inside reflector, and said outside reflector.

12. An electrooptic modulator as claimed in claim 1 wherein said layers are in turn composed of finer layers being superlattice or multiquantum-well structures.

13. An electrooptic modulator as claimed in claim 1 wherein said layers are continuously graded in composition.

14. An electrooptic modulator as claimed in claim 1 wherein the operating wavelength of the electrooptic modulator is chosen to correspond to the excitonic region, immediately below the fundamental energy gap of the resonator layer.

* * * * *

UNITED STATES PATENT AND TRADEMARK OFFICE
CERTIFICATE OF CORRECTION

PATENT NO. : 5,101,293

DATED : March 31, 1992

INVENTOR(S) : Peter C. Kemeny

It is certified that error appears in the above-identified patent and that said Letters Patent is hereby corrected as shown below:

Col. 5, line 53; "$N_r(V)$, D, $\theta$," should be --$N_r(V)$, d, $\theta$,--.

Signed and Sealed this

Seventh Day of September, 1993

Attest:

BRUCE LEHMAN

Attesting Officer

Commissioner of Patents and Trademarks